United States Patent
Mu et al.

(10) Patent No.: US 10,741,730 B2
(45) Date of Patent: Aug. 11, 2020

(54) STABILIZED LUMINESCENT NANOPARTICLES COMPRISING A PEROVSKITE SEMICONDUCTOR AND METHOD OF FABRICATION

(71) Applicant: Cree, Inc., Durham, NC (US)

(72) Inventors: Linjia Mu, Goleta, CA (US); Kenneth Lotito, Santa Barbara, CA (US); Ryan Gresback, Santa Barbara, CA (US)

(73) Assignee: CREE, INC., Durham, NC (US)

( * ) Notice: Subject to any disclaimer, the term of this patent is extended or adjusted under 35 U.S.C. 154(b) by 372 days.

(21) Appl. No.: 15/809,213

(22) Filed: Nov. 10, 2017

(65) Prior Publication Data

US 2019/0148602 A1 May 16, 2019

(51) Int. Cl.
*H01L 33/50* (2010.01)
*C09K 11/66* (2006.01)
(Continued)

(52) U.S. Cl.
CPC .......... *H01L 33/502* (2013.01); *C09K 11/025* (2013.01); *C09K 11/616* (2013.01);
(Continued)

(58) Field of Classification Search
CPC ... H01L 33/502; C09K 11/025; C09K 11/616; C09K 11/665; Y10S 977/774; Y10S 977/779; Y10S 977/831; Y10S 977/95
See application file for complete search history.

(56) References Cited

U.S. PATENT DOCUMENTS 6,350,041 B1    2/2002   Tarsa et al.
7,614,759 B2    11/2009  Negley
(Continued)

FOREIGN PATENT DOCUMENTS

WO    WO 2017/001542 A1    1/2017
WO    WO 2017/077523 A1    5/2017

OTHER PUBLICATIONS

Sun et al, Effcient and Stable White LEDs with Silica-Coated Inorganic Perovskite Quantum dots, Advanced Materials, vol. 28, issue 45, pp. 10088-10094, pub. online Sep. 26, 2016.*

(Continued)

*Primary Examiner* — C Melissa Koslow
(74) *Attorney, Agent, or Firm* — Brinks Gilson & Lione

(57) ABSTRACT

Stabilized luminescent nanoparticles for light emitting diode applications comprise perovskite nanocrystals encapsulated by an oxide coating, where the oxide coating includes ligand remnants comprising one or more elements selected from the group consisting of: nitrogen, carbon, phosphorus, and sulfur. A method of making the stabilized luminescent nanoparticles comprises dispersing perovskite nanocrystals and crosslinking ligands in a non-polar solvent to form a first mixture. Each of the crosslinking ligands comprises a head end and a tail end; the head ends attach to the perovskite nanocrystals and the tail ends remain unattached and available for crosslinking. An oxide precursor comprising crosslinking functional groups is added to the first mixture, and the crosslinking functional groups attach to the tail ends of the crosslinking ligands. Thus, an oxide coating is formed on the perovskite nanocrystals.

25 Claims, 7 Drawing Sheets

(51) Int. Cl.
*H01L 51/50* (2006.01)
*F21K 9/20* (2016.01)
*C09K 11/02* (2006.01)
*C09K 11/61* (2006.01)
*B82Y 20/00* (2011.01)
*B82Y 40/00* (2011.01)

(52) U.S. Cl.
CPC .............. *C09K 11/665* (2013.01); *F21K 9/20* (2016.08); *H01L 51/502* (2013.01); *B82Y 20/00* (2013.01); *B82Y 40/00* (2013.01); *Y10S 977/774* (2013.01); *Y10S 977/788* (2013.01); *Y10S 977/831* (2013.01); *Y10S 977/892* (2013.01); *Y10S 977/95* (2013.01)

(56) References Cited

U.S. PATENT DOCUMENTS

| | | | |
|---|---|---|---|
| 8,425,071 | B2 | 4/2013 | Ruud et al. |
| 8,563,339 | B2 | 10/2013 | Tarsa et al. |
| 8,591,062 | B2 | 11/2013 | Hussell et al. |
| 8,596,819 | B2 | 12/2013 | Negley et al. |
| 8,622,584 | B2 | 1/2014 | Kinnune et al. |
| 8,624,271 | B2 | 1/2014 | Reiherzer et al. |
| 8,777,449 | B2 | 7/2014 | Van De Ven et al. |
| 9,028,087 | B2 | 5/2015 | Wilcox et al. |
| 9,048,396 | B2 | 6/2015 | Lowes et al. |
| 9,070,850 | B2 | 6/2015 | Keller et al. |
| 9,182,096 | B2 | 11/2015 | Kinnune et al. |
| 2008/0173884 | A1 | 7/2008 | Chitnis et al. |
| 2008/0179611 | A1 | 7/2008 | Chitnis et al. |
| 2012/0051041 | A1 | 3/2012 | Edmond et al. |
| 2012/0280261 | A1 | 11/2012 | Tarsa et al. |
| 2012/0327650 | A1 | 12/2012 | Lay et al. |
| 2014/0347885 | A1 | 11/2014 | Wilcox et al. |
| 2014/0355302 | A1 | 12/2014 | Wilcox et al. |
| 2015/0253488 | A1 | 9/2015 | Wilcox et al. |
| 2015/0362168 | A1 | 12/2015 | Power et al. |
| 2017/0121598 | A1 | 5/2017 | Min et al. |
| 2017/0153382 | A1 | 6/2017 | Wang et al. |
| 2017/0186922 | A1 | 6/2017 | Kim et al. |

OTHER PUBLICATIONS

Benad, Albrecht et al., "Cold Flow as Versatile Approach for Stable and Highly Luminescent Quantum Dot—Salt Composites," *ACS Appl. Mater. Interfaces*, 8, 33 (2016) pp. 21570-21575, with Supporting Information.

Protesescu, Loredana et al., "Nanocrystals of Cesium Lead Halide Perovskites ($CsPbX_3$, X = Cl, Br, and I): Novel Optoelectronic Materials Showing Bright Emission with Wide Color Gamut," *Nano Letters*, 15, 6 (2015) pp. 3692-3696, with Supporting Information.

Sun, Chun et al., "Efficient and Stable White LEDs with Silica-Coated Inorganic Perovskite Quantum Dots," *Advanced Materials*, 28 (2016) pp. 10088-10094, with Supporting Information.

Wang, Hung-Chia et al., "Mesoporous Silica Particles Integrated with All-Inorganic $CsPbBr_3$ Perovskite Quantum-Dot Nanocomposites (MP-PQDs) with High Stability and Wide Color Gamut Used for Backlight Display," *Angew. Chem. Int. Ed.*, 55 (2016) pp. 7924-7929, with Supporting Information.

International Search Report and Written Opinion for PCT/US2018/057735, dated Jan. 23, 2019.

Zaghdoudi W. et al., "Synthesis, optical and structural properties of quantum-wells crystals grown into porous alumina," *Superlattices and Microstructures*, 71 (2014) 117-123.

\* cited by examiner

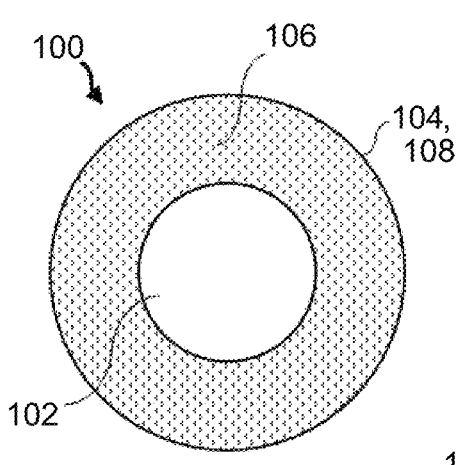
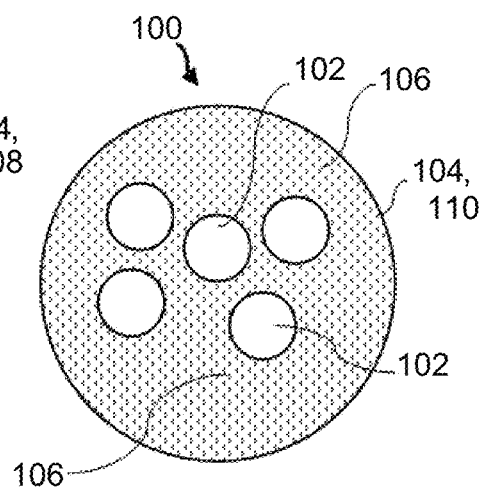
FIG. 1A  FIG. 1B
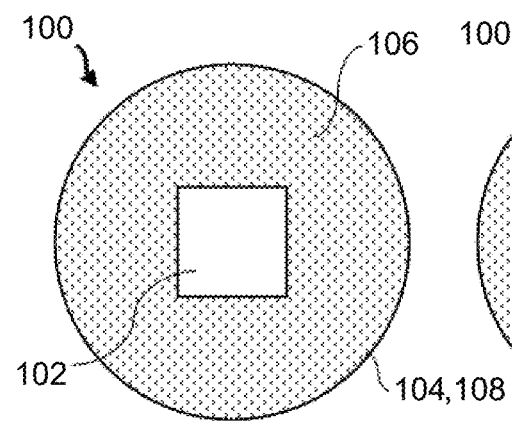
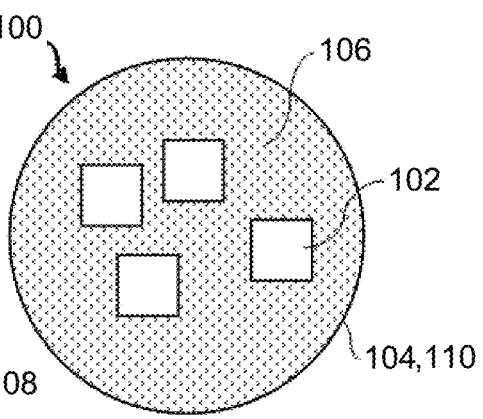
FIG. 2A  FIG. 2B

STABILIZED LUMINESCENT NANOPARTICLES COMPRISING A PEROVSKITE SEMICONDUCTOR AND METHOD OF FABRICATION

TECHNICAL FIELD

The present disclosure is related generally to luminescent particles and more specifically to stabilized perovskite nanoparticles for use in light emitting diode (LED) applications.

BACKGROUND

Perovskite nanocrystals have recently emerged as promising down-converters, due to their tunable emission wavelengths, narrow emission, non-scattering and high quantum yield (QY). These properties allow for improved LED performance by reducing losses associated with emission into the infrared, scattering to absorbing parts of the LED package, and down-conversion (i.e., low QY). One example is all-inorganic perovskite $CsPbX_3$ (X=Cl, Br, I) nanocrystals, which have demonstrated many of the desired properties for down-converters in LEDs. However, perovskite nanocrystals have limited or no stability with respect to oxygen, organic solvents, and polar solvents such as water, which limits their application in LEDs as down-converters. Their instability in polar environments also makes it challenging to process the materials; for example, growth of a protection barrier following established methods for other nanoparticles can be difficult or impossible.

BRIEF SUMMARY

Stabilized luminescent nanoparticles for light emitting diode (LED) applications and a method of fabricating such nanoparticles have been developed.

The stabilized luminescent nanoparticles comprise perovskite nanocrystals encapsulated by an oxide coating, where the oxide coating includes ligand remnants comprising one or more elements selected from the group consisting of: nitrogen, carbon, phosphorus and sulfur.

The method entails dispersing perovskite nanocrystals and crosslinking ligands in a non-polar solvent to form a first mixture. Each of the crosslinking ligands comprises a head end and a tail end; the head ends attach to the perovskite nanocrystals and the tail ends remain unattached and available for crosslinking. An oxide precursor comprising crosslinking functional groups is added to the first mixture, and the crosslinking functional groups attach to the tail ends of the crosslinking ligands. Thus, an oxide coating is formed on the perovskite nanocrystals.

BRIEF DESCRIPTION OF THE DRAWINGS

FIGS. 1A-1B and 2A-2B show schematics of exemplary stabilized luminescent nanoparticles for light emitting diode (LED) applications. The stabilized luminescent nanoparticles comprise perovskite nanocrystals encapsulated by an oxide coating, which may take the form of an oxide shell (FIGS. 1A and 2A) or an oxide matrix (FIGS. 1B and 2B).

DETAILED DESCRIPTION

Definitions

Figure 3:
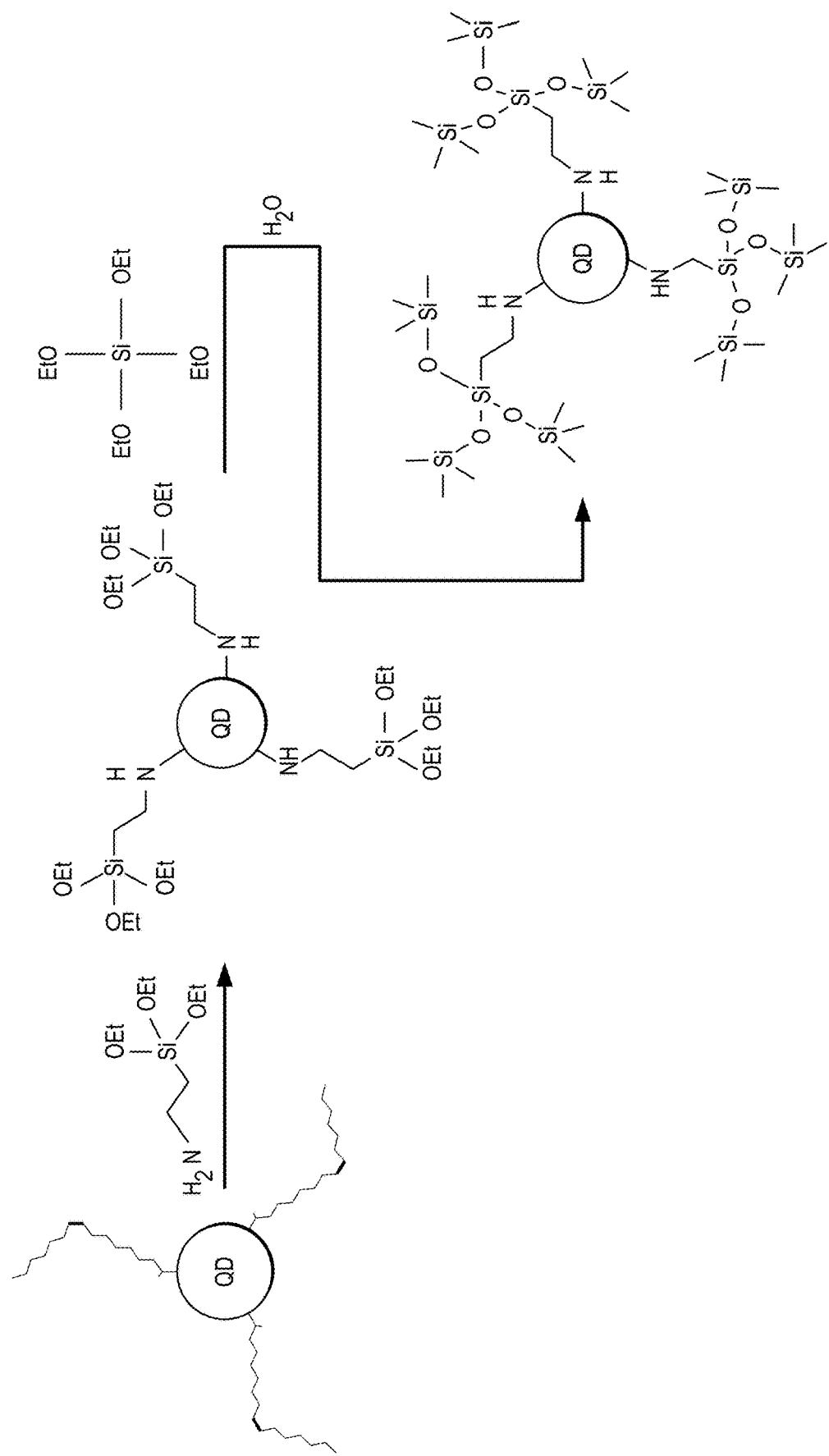
FIG. 3 is a schematic of formation of a stabilized luminescent nanoparticle from a perovskite nanocrystal comprising a perovskite semiconductor (e.g., $CsPbX_3$), crosslinking ligands comprising (3-aminopropyl) triethyoxysilane (APTES), and an oxide precursor comprising tetraethylorthosilicate (TEOS).

A "ligand" may be understood to be a molecular or ionic structure capable of binding to a metal atom (such as cesium) to form a coordination complex.

A first device that is described as being "in optical communication with" a second device may be understood to be positioned such that light from the first device reaches the second device, or vice versa.

"Dominant wavelength" refers to the wavelength of light that has the same apparent color as the light emitted from an LED, as perceived by the human eye. The dominant wavelength differs from peak wavelength in that the dominant wavelength takes into account the sensitivity of the human eye to different wavelengths of light.

It is understood that when an element such as a layer, region, or substrate is referred to as being "on" another element, it can be directly on the other element or intervening elements may also be present. Furthermore, relative terms such as "inner," "outer," "upper," "above," "over," "overlying," "beneath," "below," "top," "bottom," and similar terms, may be used herein to describe a relationship between elements. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. The terms "elements" and "a plurality of elements" may be understood to refer to "more than one element," where "element" may be replaced with any noun. It may be further understood that the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Described herein are stabilized luminescent nanoparticles for LED applications and a method to enhance the stability of the luminescent nanoparticles. The nanoparticles are individually or collectively coated in an oxide coating that protects the nanoparticles from polar solvents and oxygen, and enhances the stability of the nanoparticles in a LED environment during operation. For example, $CsPbX_3$ nanocrystals with a conformal silica shell, prepared as described below, show a much higher conversion efficiency when dispersed in silicone for use as a down-converter compared to uncoated $CsPbX_3$ nanocrystals dispersed in silicone. Densification of the coated nanoparticles under relatively mild temperatures can further increase the conversion efficiency.

Referring to FIGS. 1A-1B and 2A-2B, the stabilized luminescent nanoparticles 100 for light emitting diode (LED) applications comprise perovskite nanocrystals 102 encapsulated by an oxide coating 104. The perovskite nanocrystals 102 may comprise an all-inorganic or a hybrid perovskite semiconductor, and the oxide coating 104 may comprise an oxide such as silica ($SiO_x$, where $0.5 \leq x \leq 2.5$, e.g., $SiO_2$), alumina (e.g., $Al_2O_3$), titania (e.g., $TiO_2$), zinc oxide (e.g., ZnO) and/or boron oxide (e.g., $B_2O_3$). In the schematics of FIGS. 1A-2B, the perovskite nanocrystals have a spherical or cubic morphology, but other morphologies, such as irregular, elongated (e.g., rods), plate-like (e.g., platelets), and other polyhedral shapes are possible. During synthesis, as described below, ligands having suitable head and tail ends (i.e., functional groups) attach the perovskite nanocrystals 102 to the oxide coating 104 and may serve as an interface between the perovskite semiconductor and the oxide. Given their role in facilitating formation of the oxide coating 104, the ligands may be referred to as crosslinking ligands. After formation of the stabilized luminescent nanoparticles 100, ligand remnants 106 remain and may be detected in the oxide coating 104. The term "ligand remnants" 106 may be understood to refer to the post-synthesis chemical signature of the crosslinking ligands used to fabricate the stabilized luminescent nanoparticles 100. In other words, the ligand remnants 106 are what remain after the crosslinking ligands undergo the reaction described below to form the oxide coating 104. The ligand remnants 106 may be distributed throughout the oxide coating 104, and/or at least a portion of the ligand remnants 106 may be localized to regions of the oxide coating 104 adjacent to the perovskite nanocrystals 102.

The perovskite nanocrystals 102 may be individually coated with the oxide coating 104, as shown schematically in FIGS. 1A and 2A, where at least one (or each) of the perovskite nanocrystals 102 is surrounded by an oxide shell 108 comprising the ligand remnants 106. Alternatively, the perovskite nanocrystals 102 may be collectively coated with the oxide coating 104, as shown schematically in FIGS. 1B and 2B, where the perovskite nanocrystals 102 are embedded in an oxide matrix 110 comprising the ligand remnants 106. The perovskite nanocrystals 102 may be dispersed or agglomerated within the oxide matrix 110.

The crosslinking ligands allow for the growth of the oxide shell 108 or matrix 110, and the oxide shell 108 or matrix 110 suppresses degradation of the perovskite nanocrystals by reducing direct contact with polar solvents and/or penetration of oxygen. The oxide coating 104 (shell 108 or matrix 110) may further be coated with additional layer(s) for environmental stability using deposition methods known in the art, as described below and in U.S. Pat. No. 9,780,266, which is hereby incorporated by reference in its entirety.

The perovskite nanocrystals may have a chemical formula $ABX_3$, where A is Cs, MA or FA (where MA is $CH_3NH_3$ and FA is $H_2NCHNH_2$), B is Pb or Sn, and X is Cl, Br, and/or I, as shown below in Table 1.

TABLE 1

| Exemplary Perovskite Nanocrystals $ABX_3$ | | |
|---|---|---|
| $ABX_3$ | All-inorganic | Hybrid |
| A = | Cs | MA = $CH_3NH_3$, FA = $H_2NCHNH_2$ |
| B = | | Pb, Sn |
| X = | | Cl, Br, I, Cl/Br, Br/I |

As would be recognized by the skilled artisan, $CsPbX_3$ and $CsSnX_3$ are examples of all-inorganic perovskite semiconductors, while $MAPbX_3$ and $FAPbX_3$ are examples of hybrid perovskite semiconductors. Stabilized luminescent nanoparticles formed from different perovskite semiconductors may emit different colors when illuminated with blue or ultraviolet light; for example, $CsPbBr_3$ may be a green light emitter with an emission peak position of about 519 nm, while $CsPbBr_xI_{3-x}$ may be a green-to-red emitter with an emission peak position of about 519-660 nm. The perovskite nanocrystals may be crystalline or amorphous, and may alternatively be referred to as perovskite nanoparticles. The perovskite nanocrystals have a crystallite or primary particle size of about 100 nm or less, such as from about 1 nm to about 100 nm. Typically, the crystallite or primary particle size of the perovskite nanocrystals lies in a range from about 5 nm to about 50 nm. In addition to the composition of the perovskite nanocrystals, the crystallite size may have an impact on the color of light emitted.

For attachment to the perovskite nanocrystals, head ends of the crosslinking ligands may comprise one or more functional groups selected from among the following: amino groups, carboxylate groups, phosphate groups and thiolate groups. For attachment to the oxide coating, tail ends of the crosslinking ligands may comprise one or more of the following functional groups: silane groups, silanol groups, Si—X groups (X=Cl, Br, and/or I), and hydroxyl groups. Each crosslinking ligand may further include a linker between the head end and the tail end. The linker may comprise an aliphatic saturated or unsaturated hydrocarbon, which may be branched or unbranched. Examples of suitable crosslinking ligands include (3-aminopropyl) triethyoxysilane (APTES), 3-amino-1-propanol, and 1-amino-2-propanol.

After the reaction to form the oxide coating 104 on the perovskite nanoparticles 102, ligand remnants 106 comprising nitrogen, carbon, phosphorus, and/or sulfur can be detected in the oxide coating 104, as mentioned above. The ligand remnants 106 may have head ends comprising one or more functional groups selected from among the following: amino groups, carboxylate groups, phosphate groups, and thiolate groups. The ligand remnants may include N—H bonds, C—O bonds, P—O bonds, and/or S—H bonds. As would be recognized by one of ordinary skill in the art, the use of crosslinking ligands comprising amino groups for synthesis may result in ligand remnants 106 in the oxide coating 104 comprising nitrogen and/or N—H bonds; the use of crosslinking ligands comprising carboxylate groups for synthesis may result in ligand remnants 106 in the oxide coating 104 comprising carbon and/or C—O bonds; the use of crosslinking ligands comprising phosphate groups for synthesis may result in ligand remnants 106 in the oxide coating 104 comprising phosphorus and/or P—O bonds; and the use of crosslinking ligands comprising thiolate groups for synthesis may result in ligand remnants 106 in the oxide coating 104 comprising sulfur and/or S—H bonds. These chemical bonds and/or the elements nitrogen, carbon, phosphorus, and sulfur can be detected using chemical detection methods known in the art.

As indicated above, the oxide coating 104 (e.g., oxide shell 108 or matrix 110) may comprise an oxide such as silica, alumina, titania, zinc oxide, and/or boron oxide. In the examples in this disclosure, the oxide coating 104 comprises silica, in particular, amorphous silica. The oxide coating may have a thickness in a range from about 2 nm to about 50 nm, particularly when the coating takes the form of an oxide shell. The amount of the oxide coating may be defined in terms of a volume ratio with respect to the perovskite nanocrystals. In other words, the stabilized luminescent nanoparticles may have a total volume determined by the volume of the perovskite nanocrystals ($V_p$) and the volume of the oxide coating ($V_o$), where a volume ratio $V_p/V_o$ may lie in a range from about 0.001 to about 0.95.

The oxide coating 104 may further be a densified oxide coating formed (typically) by an annealing treatment after synthesis, as described below. In an example where the perovskite nanocrystals include a densified silica coating, an FTIR spectrum of the stabilized luminescent nanoparticles may exhibit a peak intensity ratio $R=I_{1050}/I_{3300}$ of at least about 35, where $I_{1050}$ is a peak intensity at about 1050 cm$^{-1}$ corresponding to a silica network (Si—O—Si) signal and $I_{3300}$ is a peak intensity at about 3300 cm$^{-1}$ corresponding to a silanol (Si—OH) signal. Nanoparticles including silica coatings that are not densified typically do not exhibit similarly high peak intensity ratios R.

A novel method of synthesizing the stabilized luminescent nanoparticles has been developed. The method includes dispersing perovskite nanocrystals and crosslinking ligands in a non-polar solvent to form a first mixture. Head ends of the crosslinking ligands attach to the perovskite nanocrystals and tail ends of the crosslinking ligands remain unattached and available for crosslinking. The perovskite nanocrystals may be added to the non-polar solvent before, after, or at the same time as the crosslinking ligands. The first mixture may include an excess of the crosslinking ligands.

An oxide precursor comprising crosslinking functional groups is then added to the first mixture, forming a reaction mixture. The crosslinking functional groups of the oxide precursor attach to the tail ends of the ligands, and an oxide coating is formed on the perovskite nanocrystals. After formation of the stabilized luminescent particles, ligand remnants as described above may be present in an amount sufficient to be detectable. For example, the elements nitrogen, carbon, phosphorus, and/or sulfur may be detected using energy dispersive x-ray spectroscopy (EDS), x-ray fluorescence (XRF), inductively coupled mass spectroscopy (ICP-MS), and/or inductively coupled plasma optical emission spectroscopy (ICP-OES). Chemical bonds of the ligand remnants, such as N—H bonds, C—O bonds, P—O bonds, and/or S—H bonds, may be detected using vibrational or infrared spectroscopy, Raman spectroscopy, and/or nuclear magnetic resonance (NMR) spectroscopy.

Figure 4:
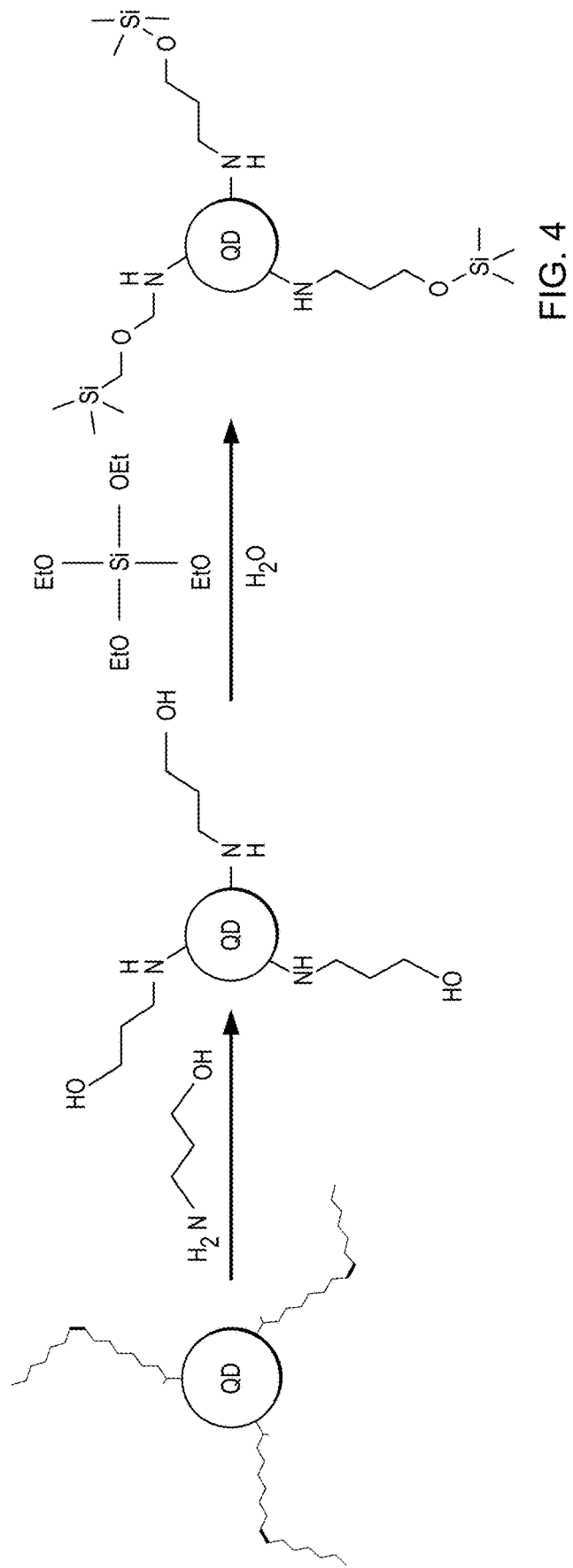
FIG. 4 is a schematic of formation of a stabilized luminescent nanoparticle from a perovskite nanocrystal comprising a perovskite semiconductor (e.g., $CsPbX_3$), crosslinking ligands comprising 3-amino-1-propanol, and an oxide precursor comprising TEOS.

The method is shown schematically in FIGS. 3 and 4 for two examples in which the nanoparticles comprise a perovskite semiconductor such as $CsPbX_3$, the crosslinking ligands comprise APTES (FIG. 3) or 3-amino-1-propanol (FIG. 4), and the oxide precursor comprises TEOS. The notation—OEt in the schematics represents—$OC_2H_5$.

Given the degradation of the perovskite nanocrystals that can occur in polar solvents such as water, the nonpolar solvent employed in the method may have a water concentration of about 0.05% or less. For example, the nonpolar solvent may comprise toluene, which is available in commercial formulations with a water concentration of about 0.03% or less.

Typically, a molar ratio of the perovskite nanocrystals (N) to the crosslinking ligands (L) to the nonpolar solvent (S) (molar ratio=N:L:S) in the first mixture is in a range from about 0.5-1.5:6-18: 5500-9500. Prior to adding the oxide precursor, the first mixture may be stirred for a time duration of about 5 minutes to about 48 hours, which may promote attachment of the crosslinking ligands.

A suitable volume ratio of the oxide precursor (0) to the nonpolar solvent (S) (molar ratio=O:S) in the reaction mixture may be in a range from about 0.5-1.5:150-250. The reaction mixture may be stirred for a period ranging from 1 hours to about 7 days. During this time, additional solvent (e.g., toluene) may be added to the reaction mixture to incorporate trace amounts of water, which facilitates hydrolysis of the oxide precursor to form the oxide coating.

The perovskite nanocrystals added to the non-polar solvent to form the first solution may include native ligands (e.g., organic ligands attached to the perovskite nanocrystals during synthesis), such that a ligand exchange occurs, where the native ligands are partially or completely replaced with the crosslinking ligands. The ligand exchange may comprising washing or etching of the perovskite nanocrystals to remove the native ligands, followed by attachment of the crosslinking ligands. The crosslinking ligands may also or alternatively be attached to the perovskite nanocrystals as the native ligands are being removed.

The perovskite nanocrystals and crosslinking ligands employed in the method may have any of the characteristics described above or elsewhere in this disclosure. For example, the perovskite nanocrystals may have a chemical formula $ABX_3$, wherein A is Cs, MA or FA, MA being $CH_3NH_3$ and FA being $H_2NCHNH_2$, B is Pb or Sn, and X is Cl, Br, and/or I. The head ends of the crosslinking ligands may comprise one or more functional groups selected from among the following: amino groups, carboxylate groups, phosphate groups and thiolate groups, and the tail ends of the crosslinking ligands may comprise one or more functional groups selected from among the following: silane groups, silanol groups, Si—X groups (X=Cl, F, Br, I, OH, OR, where R=alkyl group), and hydroxyl (—OH) groups, where suitable ligands may include (3-aminopropyl)triethyoxysilane, 3-amino-1-propanol, and/or 1-amino-2-propanol.

The oxide precursor may comprise a silica precursor, an alumina precursor, a titania precursor, a boron oxide precursor, and/or a zinc oxide precursor. Accordingly, the oxide coating formed in the reaction mixture may comprise an oxide selected from the group consisting of: silica (e.g., $SiO_2$), alumina (e.g., $Al_2O_3$), titania (e.g., $TiO_2$), boron oxide (e.g., $B_2O_3$), and zinc oxide (e.g., ZnO). For example, when the oxide coating comprises silica, a suitable oxide precursor may comprise tetraethylorthosilicate (TEOS) and/or tetramethylorthosilicate (TMOS). The oxide formed in the reaction may be amorphous or crystalline.

The method set forth above may be carried out over a wide range of temperatures that may range from above the freezing point to below the boiling point of the nonpolar solvent. For example, the temperature of the first mixture and/or the reaction mixture may be in a range from about −20° C. to about 80° C. More typically, the temperature is at or near ambient (room) temperature, such as at a temperature from about 20° C. to about 25° C.

To control the water concentration of the first mixture and the reaction mixture, the method may be carried out in a controlled environment, such as in a sealed container that is opened only for the addition of reactants. The controlled environment may comprise a humidity level of 65% or less, or from about 25% to about 65%, for example.

The method may further entail, prior to forming the first mixture, synthesizing, purifying, and then drying the perovskite nanocrystals. Solution-phase or vapor-phase methods known in the art for forming the perovskite nanocrystals may be used, and an exemplary synthesis and purification scheme is provided in the Examples. Drying of the perovskite nanocrystals may entail vacuum drying to remove solvent(s) present from synthesis and/or purification. After completion of the reaction to form the oxide coating, the perovskite nanocrystals may be isolated using methods known in the art, such as centrifugation.

After forming the oxide coating, the perovskite nanocrystals may be annealed at a relatively low temperature to increase the density of the oxide coating, thereby forming a densified oxide coating, as referred to above. The annealing may be carried out in a controlled environment, such as a vacuum or inert gas (e.g., argon, helium, nitrogen) environment. Suitable temperatures may lie in a range from about 150° C. to about 250° C., and suitable time durations may be from about 10 minutes to about 2 hours. In one example, the annealing may be carried out at a temperature of about 200° C. for about 1 hour.

The method may also comprise forming one or more barrier layers on the oxide coating to impart additional environmental stability, as set forth for example in U.S. Pat. No. 9,780,266, which was incorporated by reference above. The barrier layer may comprise an oxygen-, nitrogen- and/or carbon-containing compound. For example, the barrier layer may comprise an oxide, a carbide, a nitride, an oxynitride, an oxycarbide, or another compound. The luminescent nanoparticles may also or alternatively be encapsulated in a matrix comprising an ionic metal oxide, as set forth for example in U.S. patent application Ser. No. 15/809,241, entitled "Stabilized Quantum Dot Composite and Method of Making a Stabilized Quantum Dot Composite," which was filed on Nov. 10, 2017, and is hereby incorporated by reference. The combination of the oxide coating, the barrier layer(s) and/or matrix can inhibit degradation of the luminescent nanoparticles by limiting or preventing environmental species (e.g., gaseous oxygen and moisture) from degrading the perovskite nanocrystals. The oxide coating may in some embodiments undergo an annealing treatment as described above prior to application of the barrier layer(s) and/or encapsulation in the matrix.

EXAMPLES

1. Synthesis of Perovskite Nanocrystals (Green $CsPbBr_3$ or Red $CsPbBr_{1.2}I_{1.8}$)

Cs-oleate solution is prepared using $Cs_2CO_3$ and oleic acid, with octadecene as the solvent. Oleylamine and excess oleic acid are used to ensure Cs-oleate solution remains clear and homogeneous at room temperature. The reaction may be described as: $Cs_2CO_3 + 2C_{17}H_{33}\text{—COOH} \rightarrow 2Cs\text{—OOC—}C_{17}H_{33}$ (Cs-oleate) $+ H_2O + CO_2$ Green $CsPbBr_3$ or red $CsPbBr_{1.2}I_{1.8}$ are synthesized using $PbBr_2$, $PbI_2$ and Cs-oleate as the precursors, oleic acid and oleylamine as the ligands, and octadecene as the solvent. The experiments are conducted on the schlenk line. The reaction occurs at 200° C. for 5 s. An ice-water bath is used to halt the reaction, which may be described as: $2\text{Cs-oleate} + 3PbX_2$ (X=Br or I) $\rightarrow 2CsPbX_3 + Pb(\text{oleate})_2$ The perovskite nanocrystals are isolated and purified using hexane as the solvent and dried isopropanol as the non-solvent. A small amount of oleic acid and oleylamine is added in every wash step to keep the perovskite nanocrystals well-passivated.

Figure 5A:
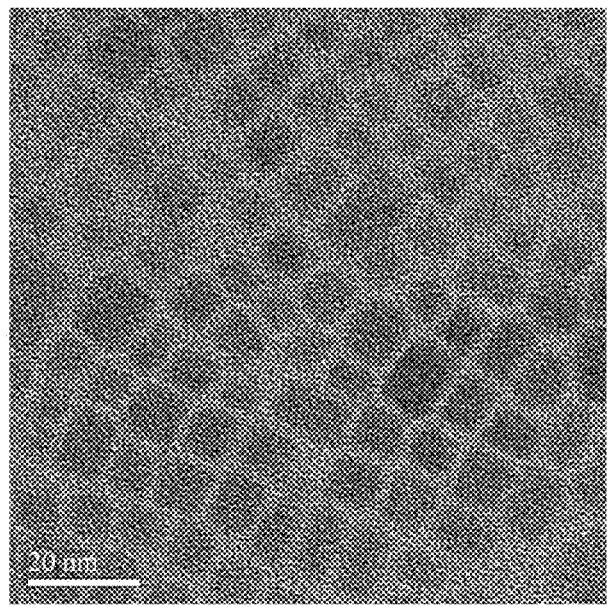
FIGS. 5A and 5B show transmission electron microscopy (TEM) images of $CsPbX_3$ nanocrystals prior to growth of a silica coating.
Figure 5B:
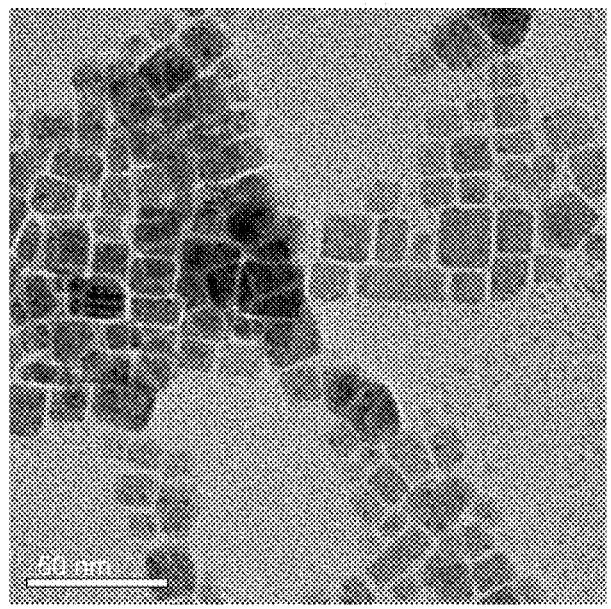

FIGS. 5A and 5B show transmission electron microscopy (TEM) images of the $CsPbX_3$ nanocrystals before prior to coating with silica; FIG. 5A shows green-emitting $CsPbBr_3$ (scale bar represents 20 nm) and FIG. 5B shows red-emitting $CsPbBr_xI_{3-x}$ (scale bar represents 50 nm).

2. Formation of an Oxide (Silica) Coating on Perovskite Nanocrystals $CsPbX_3$ nanocrystals are prepared as described above, and a silica coating is then formed on the perovskite nanocrystals.

As-purified perovskite nanocrystals are dried under vacuum to remove the solvent hexane, and then the nanoparticles are re-dispersed in toluene (CMOS, $H_2O <= 0.03\%$). Next, (3-aminopropyl) triethoxysilane (APTES) is added to the mixture (molar ratio of nanoparticles:APTES:toluene≈1:12:7000). After stirring for 1 hour, TEOS is added to the reaction (volume ratio of TEOS:toluene=1:200). The reaction mixture is stirred for three days at room temperature, during which time a trace amount of water is brought into the system by addition of wet toluene (0.03% water or less), such that TEOS is hydrolyzed to form a silica coating on the $CsPbX_3$ nanocrystals. Finally, the products are isolated by centrifugation. Purified silica-coated $CsPbX_3$ nanocrystals are obtained by repeating the procedures of re-dispersing into toluene and centrifuging. FIG. 3 shows a schematic of the reaction.

Figure 6A:
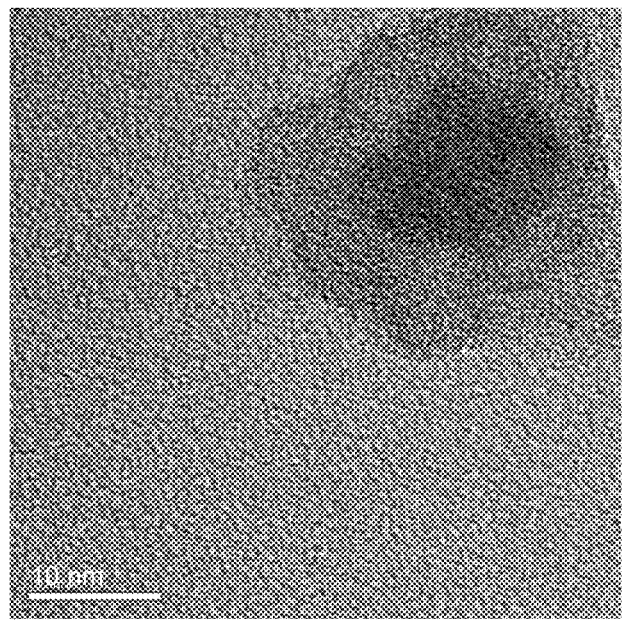
FIGS. 6A and 6B show TEM images of $CsPbX_3$ nanocrystals after growth of a silica coating.
Figure 6B:
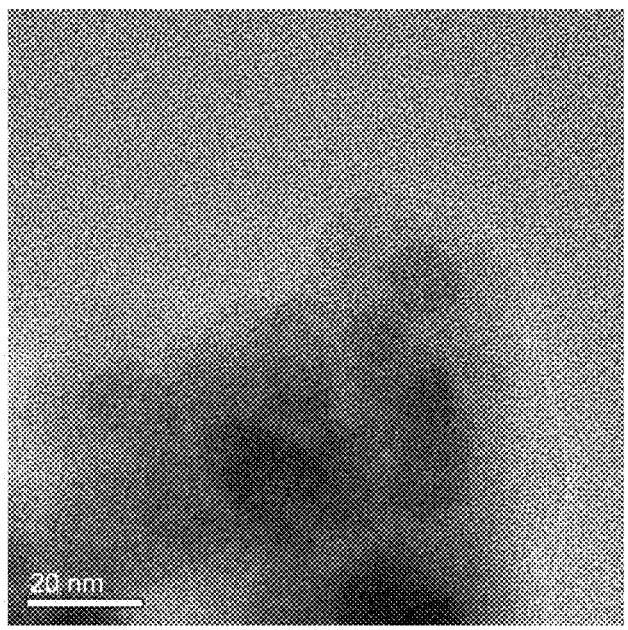

TEM images of the coated $CsPbX_3$ nanocrystals are shown in FIGS. 6A and 6B. Specifically, a single perovskite nanocrystal encased in a silica shell is shown in FIG. 6A, where the scale bar represents 10 nm, and a number of perovskite nanocrystals embedded in a silica matrix are shown in FIG. 6B, where the scale bar represents 20 nm.

3. Verification of Improved Stability

To demonstrate the enhanced stability imparted by the silica coating, perovskite nanocrystals with and without the silica coating are incorporated into Pt-catalyzed silicone and dispensed on a blue LED. Quantum yield (QY) is measured before and after the silicone is cured, as shown in Table 2. The silica coating (silica shell or silica matrix) protects the perovskite nanocrystals from etching and decomposition by external species during the incorporation into silicone, thereby enabling a much higher converter efficiency to be achieved from the silica-coated perovskite nanocrystals than from uncoated perovskite nanocrystals.

TABLE 2

Converter efficiency of exemplary perovskite nanocrystals

| | QY | | |
| --- | --- | --- | --- |
| Condition | As purified $CsPbX_3$ nanocrystals | $CsPbX_3$/silica nanocrystals | $CsPbX_3$/silica nanocrystals after annealing |
| Uncured | <10% | 43.1% | 54.0% |
| Cured | <5% | 34.6% | 42.8% |

Figure 7A:
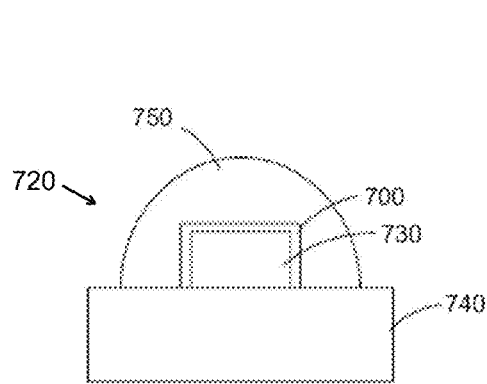
FIG. 7A shows an exemplary light emitting device comprising an LED chip in optical communication with the stabilized luminescent nanoparticles described herein.

For light emitting diode applications, the luminescent particles may absorb blue or ultraviolet light and down-convert the blue or ultraviolet light to a longer emission wavelength (e.g., green, yellow or red). Thus, referring to FIG. 7A, a light emitting device 720 may comprise a blue light emitting diode (LED) chip 730 having a dominant wavelength of 425 nm to 475 nm in optical communication with a plurality of the stabilized luminescent nanoparticles 700 described herein for down conversion of the emitted light. In this example, the stabilized luminescent nanoparticles 700 are coated on a surface of the blue LED chip 730. The blue LED chip 730 may be disposed on a submount (substrate) 740 and a lens or encapsulant 750 may overlie the LED chip 730, although other submount or package configurations are possible, as described in below. The stabilized luminescent nanoparticles 700 may alternatively be coated on an outer or inner surface of the lens 750 instead of being coated directly on the blue LED chip 730. Likewise, the stabilized luminescent nanoparticles 700 may be dispersed throughout the volume of the encapsulant 750. More than one type of LED chip (blue and/or other colors) as well as additional phosphors and/or stabilized luminescent nanoparticles 700 may be employed in the light emitting device 720.

The light emitting device may have any of a number of different packaging configurations. As is well known in the art, in order to use an LED chip in a circuit or other like arrangement, it is known to enclose the LED chip in a package to provide environmental and/or mechanical protection, color selection, light focusing and the like. An LED package may also include electrical leads, contacts or traces for electrically connecting the LED package to an external circuit.

Figure 7B:
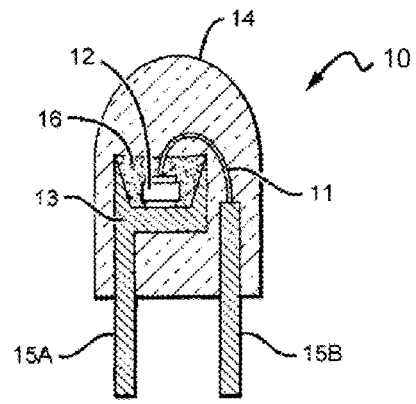
FIGS. 7B-7D show exemplary packaging configurations for a light emitting device including an LED chip and a plurality of the stabilized luminescent nanoparticles.

A typical LED package 10 is illustrated in FIG. 7B. In this example, a single LED chip 12 is mounted on a reflective cup 13 by means of a solder bond or conductive epoxy. One or more wire bonds 11 connect the contacts of the LED chip 12 to leads 15A and/or 15B, which may be attached to or integral with the reflective cup 13. The reflective cup may be filled with an encapsulant material 16 which may contain a wavelength conversion material such as a phosphor and/or the stabilized luminescent nanoparticles. The entire assembly is then encapsulated in a protective resin 14, which may be molded in the shape of a lens to collimate the light emitted from the LED chip 12.

Figure 7C:
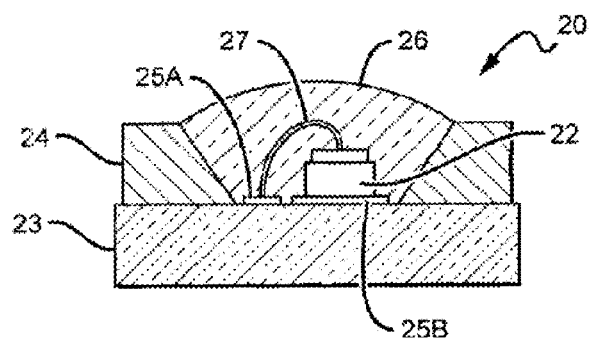

Another conventional LED package 20 is illustrated in FIG. 7C and includes one or more LED chips 22 mounted onto a carrier, such as a printed circuit board (PCB) carrier, as well as leads and a substrate or submount. In this embodiment, a reflector 24 mounted on a submount 23 surrounds the LED chip(s) 22 and reflects light emitted by the LED chip(s) 22 away from the package 20. The reflector 24 also provides mechanical protection to the LED chips 22. One or more wirebond connections 27 may be made between contacts on the LED chips 22 and electrical traces 25A, 25B on the submount 23. The mounted LED chips 22 are then covered with an encapsulant 26, such as a silicone, which may provide environmental and mechanical protection to the chips while also acting as a lens. As described above, the encapsulant may contain wavelength conversion material(s), such as the stabilized luminescent nanoparticles described herein. Other exemplary LEDs comprise LED packages formed of a plastic material that is molded about a lead frame, and the LED chip(s) is mounted in a cavity of the package, and an optically transmissive encapsulant, such as silicone, is dispensed into the cavity over the LED chip(s). Again, wavelength conversion material(s) such as the stabilized luminescent nanoparticles can be dispersed in the encapsulant.

Figure 7D:
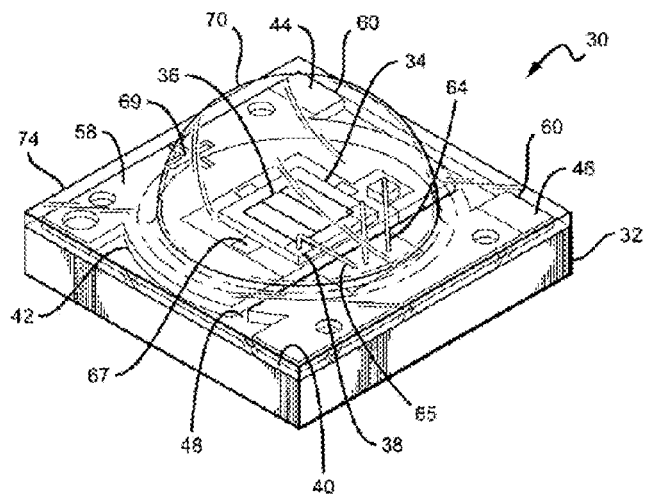

Another exemplary LED package 30 is shown in FIG. 7D and comprises an LED chip 34 on a submount 32 with a molded lens 70, such as a silicone lens, formed over it. The lens 70 can include wavelength conversion material(s), such as the stabilized luminescent nanoparticles described herein, dispersed therein and/or on the LED chip. The LED chip 32 can also be coated by a conversion material that can convert all or most of the light from the LED. The lens can be molded in different shapes, such as hemispherical, planar, chopped or other shapes. An example of such LEDs is described in U.S. Pat. Nos. 9,070,850 and 9,048,396, assigned to the same assignee as the present application and hereby incorporated by reference. It is noted that other reference numbers shown in FIG. 7D are defined in U.S. Pat. No. 9,070,850. Alternative light emitting device designs that include multiple LEDs mounted within a cavity and covered with an encapsulant with wavelength conversion material(s) dispersed therein are described in U.S. Pat. No. 8,624,271, assigned to the same assignee as the present patent application and hereby incorporated by reference.

LED chips generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED. Light is emitted by the LED chip at a primary wavelength. The primary radiation may be absorbed by the wavelength conversion material (e.g., phosphor, stabilized luminescent nanoparticles, etc.), which responsively emits light at secondary wavelength(s). The primary and/or secondary wavelengths of light can mix to produce a desired color of light. As would be understood by one of skill in the art, depending on the primary wavelength(s) and the amount of loading of the wavelength conversion material(s), as well as their light absorption/emission characteristics, various color temperatures of white light can be produced by the LEDs.

The LED chips shown schematically in FIGS. 7A-7D may be Group III nitride-based LED chips whose active region is formed from nitrogen and Group III elements such as aluminum, gallium and/or indium in the form of nitride layers epitaxially grown and doped, as would be understood by one of ordinary skill in the art, to produce light in the green to UV spectral ranges, for example blue light. As illustrated in the preceding examples, a plurality of the stabilized luminescent nanoparticles may be incorporated into silicone or another optically transparent encapsulant material and coated onto the LED chip. In other embodiments, the stabilized luminescent nanoparticles can be placed in and/or on an encapsulant and/or optic of the LED chip, such as silicone, epoxy or glass. The stabilized luminescent nanoparticles may emit at the same or different wavelengths depending on the composition and size of the perovskite particles. Also, phosphors, such as red nitride phosphors and/or green or yellow LuAG or YAG phosphors, can be mixed together with the stabilized luminescent particles in the matrix and/or positioned separately (e.g., in a remote phosphor configuration) on the optic and/or in discrete layers on the LED chip. The result may be a light emitting device that emits warm white light (e.g., 2700K to 4000K) and/or comprises a high CRI (e.g., greater than 90) and/or has an increased gamut.

The LED components, packages and light emitting devices described above may be fabricated using methods known in the art, as described for example in U.S. Patent Application Publication No. 2012/0280261, entitled "Light Emitting Diode (LED) for Achieving an Asymmetric Light Output," which is hereby incorporated by reference. In addition, the blue LED chips may be coated with the aforementioned stabilized luminescent particles or phosphors using any suitable method, such as that described U.S. Patent Application Publication Nos. 2008/0179611 and 2008/0173884, both of which are entitled "Wafer Level Phosphor Coating Method and Devices Fabricated Utilizing Method," and hereby incorporated by reference. As set forth in these patent publications, LED chips can be coated and/or sprayed by phosphors, the stabilized luminescent particles, and/or other wavelength conversion materials. The LED chips may also be coated using electrophoretic deposition (EPD), such as with the EPD method described in U.S. Pat. No. 8,563,339 to Tarsa et al., entitled "Closed Loop Electrophoretic Deposition of Semiconductor Devices," which is hereby incorporated by reference.

Figure 8A:
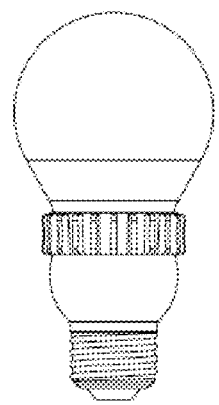
FIGS. 8A-8E show exemplary light fixtures that may utilize the light emitting devices and stabilized luminescent nanoparticles described herein.
Figure 8B:
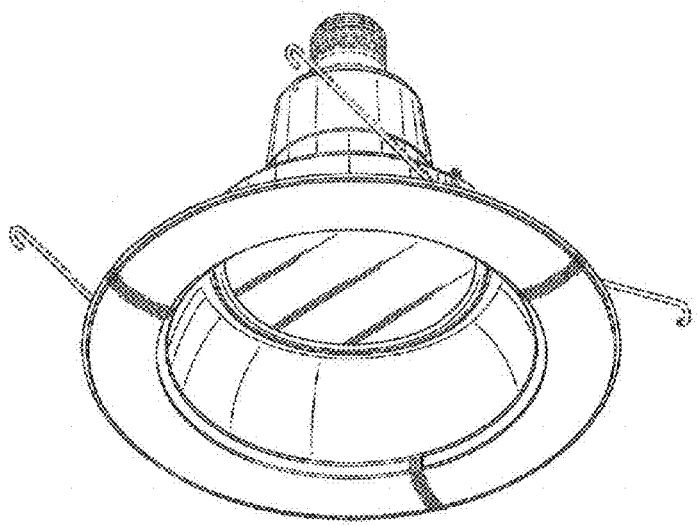
Figure 8C:
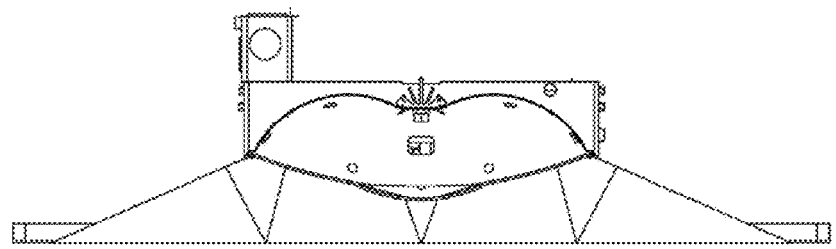
Figure 8D:
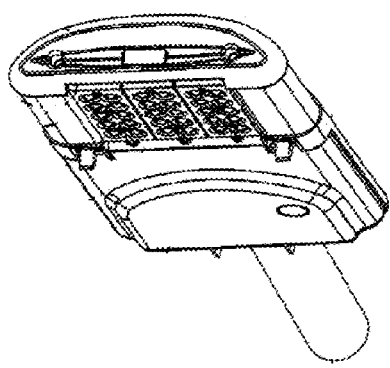
Figure 8E:
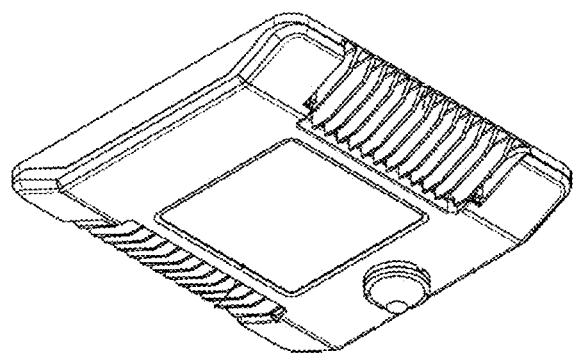

The light emitting devices and the stabilized luminescent nanoparticles described herein may have particular utility with respect to various form factor light fixtures. For example, each of the embodiments disclosed herein may be alternatively implemented in various types of solid state light fixtures including, for example, downlights, troffers, streetlights, canopy lights, parking garage lights, lights that use waveguide technology, lamps and other lighting fixtures. FIG. 8A illustrates an omnidirectional light bulb, such as an A19 bulb. Other similar consumer lights, such as PAR, BR and candelabra bulbs, can also implement the light emitting devices described herein. Exemplary lights are described in U.S. Pat. Nos. 8,591,062 and 8,596,819 and U.S. Patent Publication No. 2015/0362168, each of which is hereby incorporated by reference. FIG. 8B shows another downlight that can incorporate light emitting devices described herein. An example of such a downlight is disclosed in U.S. Pat. No. 8,777,449, which is hereby incorporated by reference. FIG. 8C illustrates a troffer light fixture that can incorporate the light emitting devices described herein. An exemplary troffer light fixture is disclosed in U.S. Published Patent Publication No. US2012/0327650, which is hereby incorporated by reference. In another example, FIG. 8D illustrates a solid state streetlight that may include the light emitting devices described herein. Other streetlights and outdoor lighting fixtures that can be implemented using the light-emitting devices described herein include the lights disclosed in U.S. Pat. Nos. 8,622,584; 8,425,071; 9,028,087; and U.S. Patent Publication No. 2015/0253488, each of which is hereby incorporated by reference. Finally, FIG. 8E illustrates a canopy light which is described in U.S. Pat. No. 9,182,096, which is hereby incorporated by reference. Light emitting devices described herein may also be implemented in various other lighting fixtures, such as, for example, in the waveguide-based troffers disclosed in U.S. Patent Publication No. 2014/0347885, in the troffer style fixtures disclosed in U.S. Patent Publication No. 2012/0051041 and/or in the waveguide-based garage lights disclosed in U.S. Patent Publication No. 2014/0355302, each of which is hereby incorporated by reference. Other and similar light fixtures can be implemented using the above-described circuitry.

As known to those skilled in the art, lamps have been developed utilizing solid state light sources, such as LEDs, in combination with a conversion material that is separated from or remote to the LEDs. Such arrangements are disclosed in U.S. Pat. No. 6,350,041, entitled "High Output Radial Dispersing Lamp Using a Solid State Light Source," which is hereby incorporated by reference. Suitable lamps can comprise a solid state light source that transmits light through a separator to a disperser including one or more phosphors and/or stabilized luminescent nanoparticles. The disperser can disperse the light in a desired pattern and/or changes its color by converting at least some of the light to a different wavelength through the phosphor(s), stabilized luminescent nanoparticles, and/or other conversion material. In some embodiments, the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759, entitled "Lighting Device," which is hereby incorporated by reference.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. Stabilized luminescent nanoparticles for light emitting diode (LED) applications, the stabilized luminescent nanoparticles comprising:

perovskite nanocrystals encapsulated by an oxide coating, wherein the oxide coating includes ligand remnants comprising one or more elements selected from the group consisting of: nitrogen, carbon, phosphorus, and sulfur, and wherein a ratio $V_p/V_o$ of a volume ($V_p$) of the perovskite nanocrystals to a volume ($V_o$) of the oxide coating is in a range from about 0.001 to about 0.95.

2. The stabilized luminescent nanoparticles of claim 1, wherein the perovskite nanocrystals are individually coated with the oxide coating, each of the perovskite nanocrystals being surrounded by an oxide shell comprising the ligand remnants.

3. The stabilized luminescent nanoparticles of claim 1, wherein the perovskite nanocrystals are collectively coated with the oxide coating, the perovskite nanocrystals being embedded in an oxide matrix comprising the ligand remnants.

4. The stabilized luminescent nanoparticles of claim 1, wherein the oxide coating comprises an oxide selected from the group consisting of: silica, alumina, titania, boron oxide, and zinc oxide.

5. The stabilized luminescent nanoparticles of claim 1 comprising a chemical formula $ABX_3$, wherein
A is Cs, MA or FA, MA being $CH_3NH_3$ and FA being $H_2NCHNH_2$,
B is Pb or Sn, and
X is Cl, Br, and/or I.

6. The stabilized luminescent nanoparticles of claim 1, wherein the ligand remnants are distributed throughout the oxide coating.

7. The stabilized luminescent nanoparticles of claim 1, wherein at least a portion of the ligand remnants are localized to regions of the oxide coating adjacent to the perovskite nanocrystals.

8. The stabilized luminescent nanoparticles of claim 1, wherein the ligand remnants comprise N—H bonds, C—O bonds, P—O bonds, and/or S—H bonds.

9. The stabilized luminescent nanoparticles of claim 1, wherein the ligand remnants include head ends comprising one or more functional groups selected from the group consisting of: amino groups, carboxylate groups, phosphate groups, and thiolate groups.

10. The stabilized luminescent nanoparticles of claim 1, wherein the ligand remnants are present in an amount detectable by one or more of the following techniques: energy dispersive x-ray spectroscopy (EDS), x-ray fluorescence (XRF), inductively coupled mass spectroscopy (ICP-MS), inductively coupled plasma optical emission spectroscopy (ICP-OES), vibrational or infrared spectroscopy, Raman spectroscopy, or nuclear magnetic resonance (NMR) spectroscopy.

11. The stabilized luminescent nanoparticles of claim 1, wherein the oxide coating has a thickness in a range from about 2 nm to about 50 nm.

12. A light emitting device comprising:
a blue light emitting diode (LED) chip having a dominant wavelength of 425 nm to 475 nm in optical communication with the stabilized luminescent nanoparticles of claim 1 for down conversion of light emitted from the blue LED chip.

13. A lighting fixture comprising the light emitting device of claim 12, the lighting fixture selected from the group consisting of: omnidirectional light bulb, candelabra bulb, downlight, troffer, street light, outdoor light, canopy light, parking garage light, waveguide-based troffer, waveguide-based garage light, and lamp.

14. A method of making stabilized luminescent nanoparticles, the method comprising:
dispersing perovskite nanocrystals and crosslinking ligands in a non-polar solvent to form a first mixture, each of the crosslinking ligands comprising a head end and a tail end, the head ends attaching to the perovskite nanocrystals and the tail ends remaining unattached and available for crosslinking; and adding an oxide precursor comprising crosslinking functional groups to the first mixture, the crosslinking functional groups attaching to the tail ends of the crosslinking ligands,
thereby forming an oxide coating on the perovskite nanocrystals.

15. The method of claim 14, wherein the non-polar solvent comprises a water concentration of about 0.05% or less.

16. The method of claim 14, wherein the non-polar solvent comprises toluene.

17. The method of claim 14, wherein the head ends of the crosslinking ligands comprise one or more functional groups selected from the group consisting of: amino groups, carboxylate groups, phosphate groups and thiolate groups, and
wherein the tail ends of the crosslinking ligands comprise one or more functional groups selected from the group consisting of: silane groups, silanol groups, Si—X groups (X=Cl, Br, and/or I), and hydroxyl groups, and
wherein the perovskite nanocrystals have a chemical formula $ABX_3$, wherein
A is Cs, MA or FA, MA being $CH_3NH_3$ and FA being $H_2NCHNH_2$,
B is Pb or Sn, and
X is Cl, Br, and/or I.

18. The method of claim 14, wherein, prior to attachment of the head ends of the crosslinking ligands to the perovskite nanocrystals, the perovskite nanocrystals include organic ligands, and further comprising removing the organic ligands from the perovskite nanocrystals.

19. The method of claim 14, wherein the oxide precursor is selected from the group consisting of: a silica precursor, an alumina precursor, a titania precursor, a boron oxide precursor, and a zinc oxide precursor, and
wherein the oxide coating comprises an oxide selected from the group consisting of: silica, alumina, titania, boron oxide and zinc oxide.

20. The method of claim 19, wherein the oxide precursor is a silica precursor selected from the group consisting of: tetraethylorthosilicate (TEOS) and tetramethylorthosilicate (TMOS), and wherein the oxide coating comprises amorphous silica.

21. The method of claim 14 being carried out in a controlled environment comprising a humidity in a range from about 25% to about 65%.

22. The method of claim 14, further comprising, after forming the oxide coating, annealing the perovskite nanocrystals to densify the oxide coating.

23. The method of claim 14, further comprising, after forming the oxide coating, forming one or more barrier layers on the oxide coating.

24. The method of claim 14, further comprising, prior to forming the first mixture:
synthesizing the perovskite nanocrystals;
purifying the perovskite nanocrystals; and
drying the perovskite nanocrystals.

25. Stabilized luminescent nanoparticles for light emitting diode (LED) applications, the stabilized luminescent nanoparticles comprising:
perovskite nanocrystals encapsulated by an oxide coating,
wherein the oxide coating includes ligand remnants comprising one or more elements selected from the group consisting of: nitrogen, carbon, phosphorus, and sulfur, and wherein the oxide coating has a thickness in a range from about 2 nm to about 50 nm.

* * * * *